(12) United States Patent
Lai et al.

(10) Patent No.: US 11,809,083 B2
(45) Date of Patent: Nov. 7, 2023

(54) EUV PHOTOLITHOGRAPHY SYSTEM FUEL SOURCE AND METHODS OF OPERATING THE SAME

(71) Applicant: Taiwan Semiconductor Manufacturing Co., Ltd., Hsinchu (TW)

(72) Inventors: Cheng-Hao Lai, Hsinchu (TW); Ming-Hsun Tsai, Hsinchu (TW); Hsin-Feng Chen, Hsinchu (TW); Wei-Shin Cheng, Hsinchu (TW); Yu-Kuang Sun, Hsinchu (TW); Cheng-Hsuan Wu, Hsinchu (TW); Yu-Fa Lo, Hsinchu (TW); Shih-Yu Tu, Hsinchu (TW); Jou-Hsuan Lu, Hsinchu (TW); Shang-Chieh Chien, Hsinchu (TW); Li-Jui Chen, Hsinchu (TW); Heng-Hsin Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 102 days.

(21) Appl. No.: 17/494,558

(22) Filed: Oct. 5, 2021

(65) Prior Publication Data
US 2022/0334495 A1 Oct. 20, 2022

Related U.S. Application Data

(60) Provisional application No. 63/175,995, filed on Apr. 16, 2021.

(51) Int. Cl.
*G03F 7/20* (2006.01)
*G03F 7/00* (2006.01)

(52) U.S. Cl.
CPC ............................... *G03F 7/70033* (2013.01)

(58) Field of Classification Search
CPC .................................................. G03F 7/70033
See application file for complete search history.

(56) References Cited

U.S. PATENT DOCUMENTS

2006/0193997 A1* 8/2006 Bykanov ............. G03F 7/70033
118/720

* cited by examiner

*Primary Examiner* — Nicole M Ippolito
*Assistant Examiner* — Hanway Chang
(74) *Attorney, Agent, or Firm* — Seed IP Law Group LLP

(57) ABSTRACT

Impurities in a liquefied solid fuel utilized in a droplet generator of an extreme ultraviolet photolithography system are removed from vessels containing the liquefied solid fuel. Removal of the impurities increases the stability and predictability of droplet formation which positively impacts wafer yield and droplet generator lifetime.

20 Claims, 8 Drawing Sheets

EUV PHOTOLITHOGRAPHY SYSTEM FUEL SOURCE AND METHODS OF OPERATING THE SAME

BACKGROUND

Technical Field

The present disclosure relates to the field of photolithography. The present disclosure relates more particularly to extreme ultraviolet photolithography.

Description of the Related Art

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

The features on an integrated circuit die are produced, in part, with the aid of photolithography. Traditional photolithography techniques include generating a mask outlining the shape of features to be formed on an integrated circuit die. A photolithography light source irradiates the integrated circuit die through the mask. The size of the features that can be produced via photolithography of the integrated circuit die is limited, in part, on the lower end, by the wavelength of light produced by the photolithography light source. Smaller wavelengths of light can produce smaller feature sizes.

Extreme ultraviolet light is used to produce particularly small features due to the relatively short wavelength of extreme ultraviolet light. For example, extreme ultraviolet light is typically produced by irradiating droplets of selected materials from a droplet generator with a laser beam. The energy from the laser causes the droplets to enter a plasma state. In the plasma state, the droplets emit extreme ultraviolet light. The extreme ultraviolet light travels toward a collector with an elliptical or parabolic surface. The collector reflects the extreme ultraviolet light onto the photolithography target.

DETAILED DESCRIPTION

Figure 1:
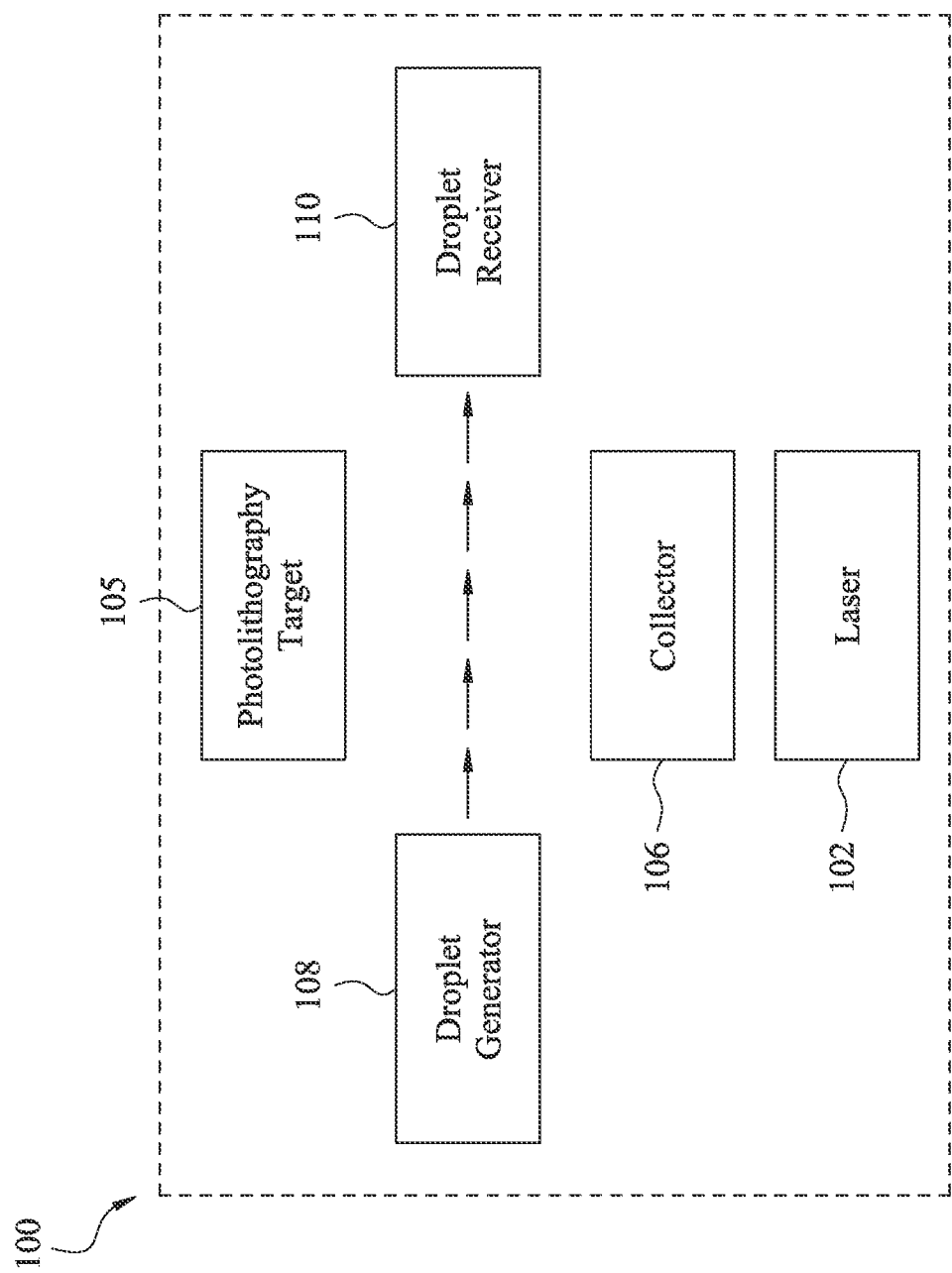
FIG. 1 is a block diagram of a photolithography system, according to one embodiment.

In the following description, specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

"Vertical direction" and "horizontal direction" are to be understood as indicating relative directions. Thus, the horizontal direction is to be understood as substantially perpendicular to the vertical direction and vice versa. Nevertheless, it is within the scope of the present disclosure that the described embodiments and aspects may be rotated in its entirety such that the dimension referred to as the vertical direction is oriented horizontally and, at the same time, the dimension referred to as the horizontal direction is oriented vertically.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments in accordance with the present disclosure provide methods and systems for removing impurities from a liquid fuel that is supplied to a droplet generator of an EUV photolithography system. If not removed, the impurities can negatively affect the ability of the DGA to stably generate droplets. If the DGA is not able to generate droplets in a stable manner, the quality of the pattern features degrades. Embodiments in accordance with the present disclosure concentrate the impurities near an interface between the liquid fuel and a gaseous headspace in the vessel containing the liquid fuel. Impurities are removed from the vessel, e.g., by drawing them into a suction conduit. In accordance with some embodiments, the distance the suction conduit penetrates into the liquid fuel is controlled such that the inlet of the suction conduit is not too far below the location where the impurities are concentrated. When the suction conduit penetrates into the liquid fuel such that the inlet of the suction conduit is too far below the location where the impurities are concentrated, drawing the impurities into the suction conduit becomes more challenging.

FIG. 1 is a block diagram of a photolithography system 100. The photolithography system 100 includes a laser 102, a photolithography target 105, a collector 106, a droplet generator 108, and a droplet receiver 110. The droplet receiver 110 includes a droplet pool (not shown in FIG. 1) in which the droplets received by the droplet receiver accumulate. The components of the photolithography system 100 cooperate to generate extreme ultraviolet (EUV) radiation which is used in an EUV photolithography process to pattern materials on the photolithography target.

The droplet generator 108 generates and outputs a stream of droplets. The droplets can include, in one example, liquid (melted) tin. Other materials can be used for the droplets without departing from the scope of the present disclosure. The droplets move at a high rate of speed toward the droplet receiver 110. The photolithography system 100 utilizes the droplets to generate extreme ultraviolet light for photolithography processes. Extreme ultraviolet light typically corresponds to light with wavelengths between 5 nm and 125 nm.

The laser 102 outputs a laser beam. The laser beam is focused on a point through which the droplets pass on their way from the droplet generator 108 to the droplet receiver 110. In particular, the laser 102 outputs laser pulses. Each laser pulse is received by a droplet. When the droplet receives one or more of the laser pulses, the energy from the laser pulses generates a high-energy plasma from the droplet. The high-energy plasma outputs extreme ultraviolet radiation.

In one embodiment, the radiation output by the plasma scatters randomly in many directions. The photolithography system 100 utilizes the collector 106 to collect the scattered extreme ultraviolet radiation from the plasma droplets and reflect the extreme ultraviolet radiation toward a photolithography target 105, or toward equipment that will guide the extreme ultraviolet radiation to the photolithography target 105.

In one embodiment, the collector 106 includes an aperture. The laser pulses from the laser 102 pass through the aperture toward the stream of droplets. This enables the collector 106 to be positioned between the laser 102 and the photolithography target 105.

After the droplets have been irradiated by the laser 102, the droplets continue with a trajectory toward the droplet receiver 110. The droplet receiver 110 receives the droplets. The droplets can be drained from the droplet receiver 110 and reused or disposed of.

Figure 2:
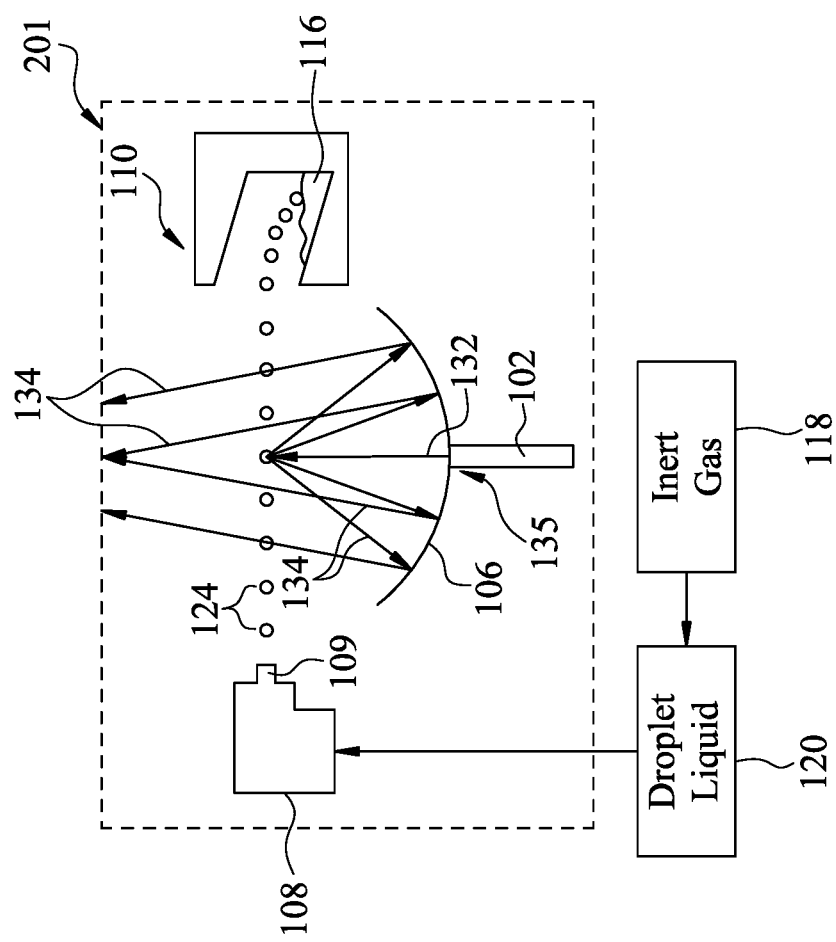
FIG. 2 is a block diagram of a photolithography system, according to one embodiment.

FIG. 2 is a more detailed illustration of a photolithography system 201, according to an embodiment of the present disclosure. The photolithography system 201 includes a laser 102, a collector 106, a droplet generator 108 including a droplet generator nozzle 109, a droplet receiver 110 including a droplet pool 116, a source of droplet liquid 120 and a source of an inert gas 118.

In the illustrated embodiment, the droplet generator 108 generates and outputs a stream of droplets 124. The droplets are formed by driving a droplet liquid through a source of droplets, e.g., a droplet generator nozzle 109 of the droplet generator 108. The droplet liquid is supplied to the droplet generator 108 from a source of droplet liquid 120. The droplet liquid delivered to the droplet generator 108 is pressurized to drive the droplet liquid through the nozzle 109. In one embodiment, the source of droplet liquid 120 is in fluid communication with the first source of inert gas 118, e.g., argon. The inert gas exerts a pressure on the droplet liquid that is fed from the source of droplet liquid 120 to the droplet generator 108. In other embodiments, the pressure exerted on the droplet liquid is supplemented by a mechanical device or energy. In other embodiments, the pressure exerted on the droplet liquid is provided by a mechanical device or energy. The droplets can include, as described previously, tin. The droplets 124 ejected from nozzle 109 move at a high rate of speed toward the droplet receiver 110. The rate at which the droplets 124 are generated by droplet generator 108 is controlled and coordinated with pulsing of the laser 102 such that as many droplets as possible are irradiated to generate the plasma which generates the EUV radiation. The droplet generator nozzle 109 ejects the droplets such that the droplets have X, Y and Z direction coordinates that cause as many, if not all, of the droplets to be received by the droplet receiver 110, such that the droplets do not impinge upon the reflective surface of collector 106 or other surfaces of the photolithography system 201 where deposition of the droplets is not desired.

The laser 102 is positioned behind a collector 106. The laser 102 outputs pulses of laser light 132. The pulses of laser light 132 are focused on a point through which the droplets pass on their way from the droplet generator nozzle 109 to the droplet receiver 110. Each pulse of laser light 132 is received by a droplet 124. When the droplet 124 receives one or more of the pulses of laser light 132, the energy from the laser pulses generates a high-energy plasma from the droplet 124. The high-energy plasma outputs extreme ultraviolet radiation.

In one embodiment, the laser 102 is a carbon dioxide (CO2) laser. The CO2 laser emits radiation or laser light 132 with a wavelength centered around 9.4 µm or 10.6 µm. The laser 102 can include lasers other than carbon dioxide lasers and can output radiation with other wavelengths than those described above without departing from the scope of the present disclosure.

In one embodiment the droplet generator 108 generates between 40,000 and 60,000 droplets per second. The droplets 124 have an initial velocity of between 70 m/s and 90 m/s. The droplets have a diameter between 10 µm and 200 µm. The droplet generator 108 can generate different numbers of droplets per second than described above without departing from the scope of the present disclosure. The droplet generator 108 can also generate droplets having different initial velocities and diameters than those described above without departing from the scope of the present disclosure.

In one embodiment, the laser 102 irradiates each droplet 124 with two pulses. A first pulse causes the droplet 124 to flatten into a disk-like shape. The second pulse causes the droplet 124 to form a high temperature plasma. The second pulse is significantly more powerful than the first pulse. The laser 102 and the droplet generator 108 are calibrated so that the laser 102 emits pairs of pulses such that each droplet 124 is irradiated with a pair of pulses. For example, if the droplet generator 108 outputs 50,000 droplets per second, the laser 102 will output 50,000 pairs of pulses per second. The laser 102 can irradiate droplets 124 in a manner other than described above without departing from the scope of the present disclosure. For example, the laser 102 may irradiate each droplet 124 with a single pulse or with more pulses than two.

In one embodiment, the droplets 124 are tin. When the tin droplets 124 are converted to a plasma, the tin droplets 124 output extreme ultraviolet radiation 134 with a wavelength centered between 10 nm and 15 nm. More particularly, in one embodiment the tin plasma shines with a characteristic wavelength of 13.5 nm. These wavelengths correspond to extreme ultraviolet radiation. Materials other than tin can be used for the droplets 124 without departing from the scope of the present disclosure. Such other materials may generate extreme ultraviolet radiation with wavelengths other than those described above without departing from the scope of the present disclosure.

In one embodiment, the radiation 134 output by the droplets scatters randomly in many directions. The photolithography system 100 utilizes the collector 106 to collect the scattered extreme ultraviolet radiation 134 from the plasma and output the extreme ultraviolet radiation toward a photolithography target 105.

In one embodiment, the collector 106 is a parabolic or elliptical mirror. The scattered radiation 134 is collected and reflected by the parabolic or elliptical mirror with a trajectory toward a photolithography target 105.

In one embodiment, the collector 106 includes an aperture 135. The pulses of laser light 132 pass from the laser 102 through the aperture 135 toward the stream of droplets 124. This enables the collector 106 to be positioned between the laser 102 and the photolithography target 105.

After the droplets 124 have been irradiated by the laser 102, the droplets 124 continue with a trajectory toward the droplet receiver 110. In particular, the droplets enter the droplet receiver 110 and travel through an interior passage toward a droplet pool 116 at a back end of the droplet receiver 110. The droplet pool 116 collects the droplets 124. The droplet receiver 110 can further include a drain port (not shown) that drains the droplet pool 116. The droplets 124 can be reused or disposed of.

Figure 3:
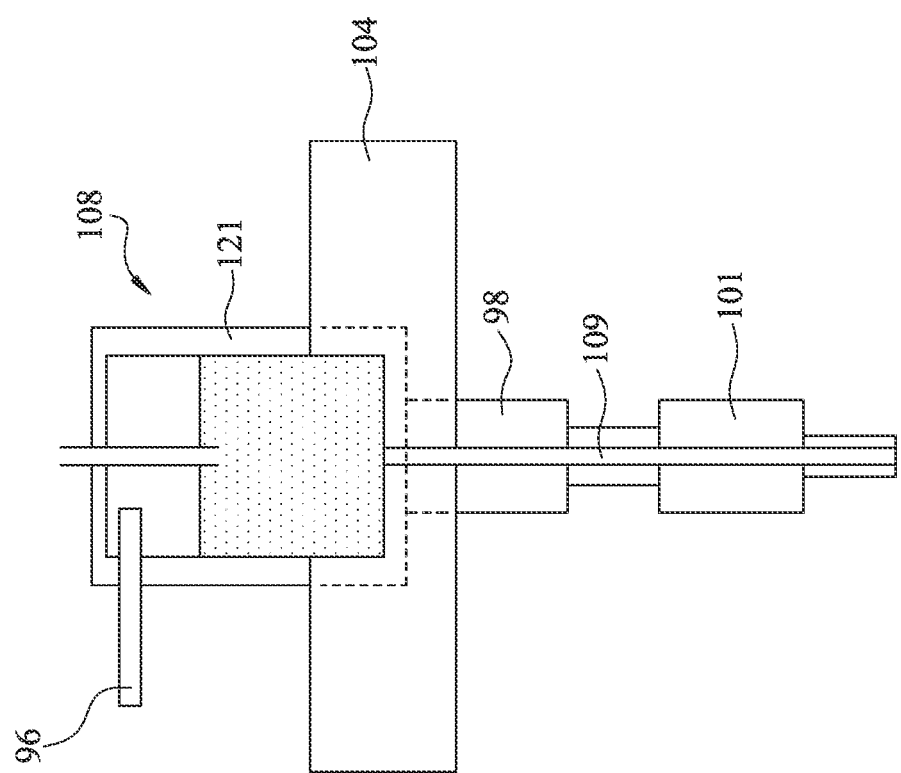
FIG. 3 is a schematic top view of droplet generator in accordance with an embodiment of the present disclosure.

FIG. 3 shows in greater detail a portion of a droplet generator 108 for generating droplets. For the generalized embodiment shown in FIG. 3, droplet generator 108 includes a reservoir 121 holding a molten droplet liquid material such as tin. Heating elements (not shown) controllably maintain portions of the droplet generator 108 at a temperature above the melting temperature of the material comprising the droplet liquid. The molten droplet material may be placed under pressure by using an inert gas such as argon from the inert gas source 118 in FIG. 2 via line 96. The pressure preferably forces the molten droplet material to pass through a set of filters 98. From the filters 98, the material may pass through a valve 101 to a nozzle 109. For example valve 101 may be a thermal valve. A Peltier device may be employed to establish the valve 101, freezing target material between the filters 98 and nozzle 109 to close the valve 101 and heating the solidified target material to open the valve 101. FIG. 3 also shows that the droplet generator 108 includes a movable member 104 such that motion of the movable member 104 changes the position of the point at which droplets are released from the nozzle 109. Motion of the movable member 104 is controlled by a droplet release point positioning system (not shown). The inert gas is not limited to argon and maybe helium or nitrogen or another gas that does not react with tin to form oxides of tin or does not react with the nozzle to form oxides of the material from which the nozzle 109 is manufactured.

For the droplet generator 108, one or more modulating or non-modulating droplet liquid dispensers may be used. For example, a modulating dispenser may be used having a capillary tube formed with an orifice. The nozzle 109 may include one or more electro-actuatable elements, e.g., actuators made of a piezoelectric material, which can be selectively expanded or contracted to deform the capillary tube and modulate a release of source material from the nozzle 109.

As stated, the droplets are released by a nozzle 109. To be useful as a nozzle, the nozzle preferably is able to operate at relatively high pressures, for example, from about 6000 pounds per square inch to about 8000 pounds per square inch. It is also preferable that the nozzle permit good control over the exit angle and velocity of the droplets. It is also preferable that the nozzle enable flexibility in permitting multiple design options for coupling the nozzle to other components in the system, in particular, to elements that are provided to modulate the droplet stream.

Figure 4:
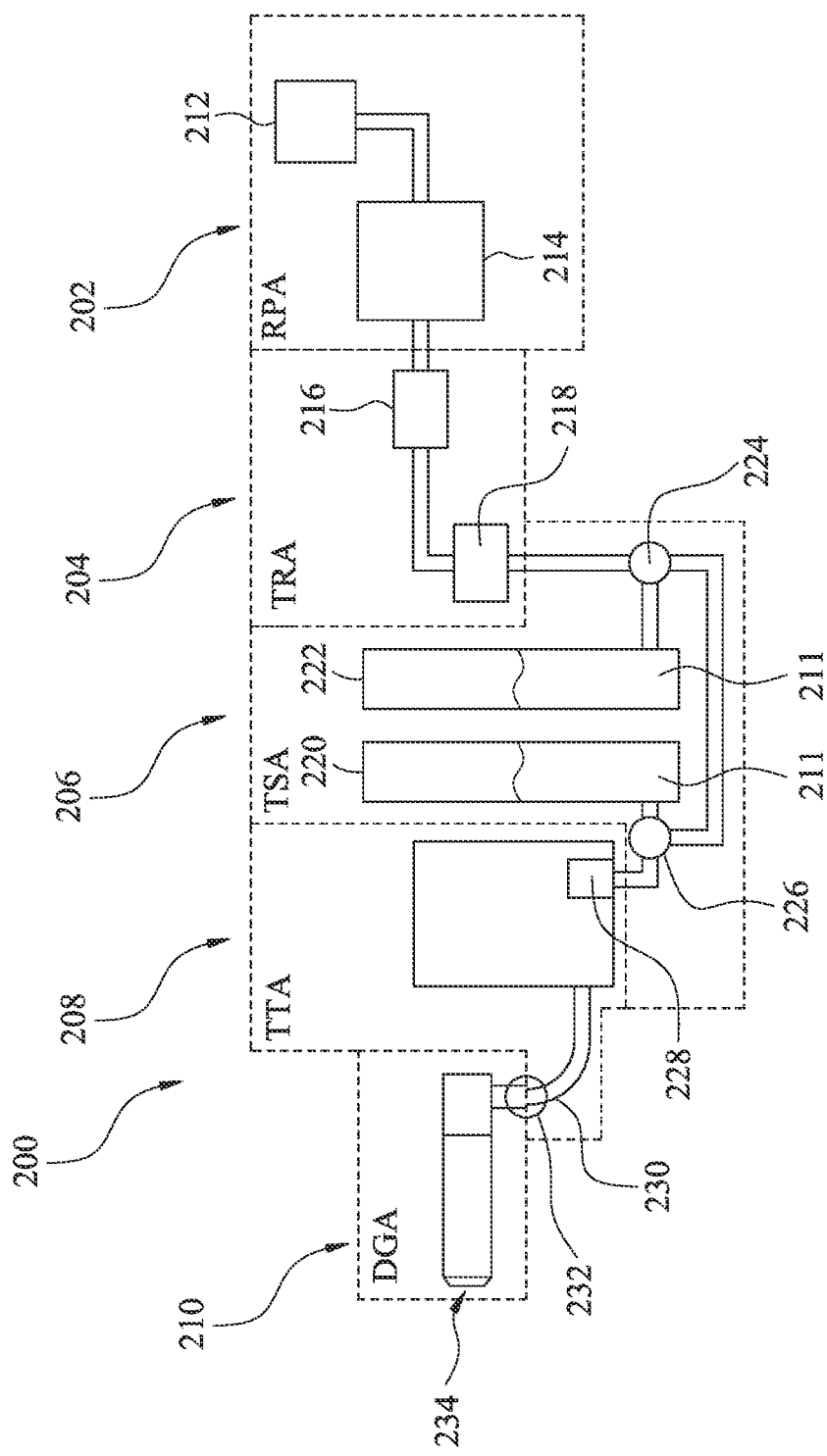
FIG. 4 is a schematic view of a delivery system for providing liquid fuel to a droplet generator in accordance with an embodiment of the present disclosure.

FIG. 4 illustrates delivery system 200 for delivering fuel, e.g., molten tin, to a DGA 210 of the present disclosure that is useful in an EUV lithography system. The delivery system 200 includes a refill and priming assembly (RPA) 202, a liquid (e.g., molten tin) refill assembly (TRA) 204, a liquid fuel (e.g., molten tin) storage or supply assembly (TSA) 206, a liquid fuel (e.g., molten tin) transfer assembly (TTA) 208, and a droplet generator assembly (DGA) 210 with nozzle 234. When the DGA 210 is discharging or ejecting a liquid fuel 211, the liquid fuel 211 moves through the various components of the fuel delivery system 200 in a direction along the fuel delivery system 200 from the TRA 204 to the DGA 210. The liquid fuel 211 is the same or similar to the molten tin as discussed earlier in the present disclosure with respect to FIGS. 1-3.

The RPA 202 is coupled to and in fluid communication with the TRA 204. The RPA 202 is configured to be utilized to convert a solidified fuel into a liquid phase. For example, a solidified fuel (e.g., solid tin) is placed within a heating element or component (e.g., heating container) 212 that heats up the solidified fuel causing a phase change from the solidified fuel to the liquid fuel 211. The liquid fuel 211 then moves along the RPA 202 to a filter/tank 214 that filters the liquid fuel 211 to remove contaminants or impurities present within the liquid fuel 211 that may still be solid phase and stores the filtered liquid fuel. All the filter is effective in removing some contaminants or impurities from the liquid fuel, some are not removed by the filter or form in the liquid fuel after it has passed through the filter. For example, oxides of the liquid fuel may form in the liquid fuel as well as bubbles of gas. Both of these impurities can negatively impact the stability of droplets formed by the DGA 210 utilizing a liquid fuel that includes such impurities. When there is a demand for the filtered liquid fuel 211, the liquid fuel 211 enters a first end 216 of the TRA 204 and passes through the TRA 204 to a second end 218 of the TRA 204. The liquid fuel 211 then enters the TSA 206. The TRA 204 may be a pipe.

After the liquid fuel 211 passes through the second end 218 of the TRA 204, the liquid fuel 211 enters the TSA 206. The liquid fuel 211 is stored in at least one liquid fuel container or vessel of the TSA 206. In this embodiment, the TSA 206 includes a first liquid fuel container 220 and a second liquid fuel container 222. The liquid fuel 211 is stored in the first and second containers 220, 222, and the first and second containers 220, 222 may be opened and closed in a controlled manner to limit an amount of liquid fuel 211 provided to the TTA 208. For example, the amount of liquid fuel 211 introduced into the TTA 208 may be controlled by controlling opening and closing of a plurality of valves 224, 226 in fluid communication with the first and second liquid fuel containers 220, 222, respectively. In this embodiment, the plurality of valves 224, 226 includes a first valve 224 in fluid communication between the TSA 206 and the TRA 204 and a second valve 226 in fluid communication between the TSA 206 and the TTA 208. The TTA 208 may be a pipe.

Limiting the amount of the liquid fuel 211 provided to the TTA 208 limits and controls the amount of the liquid fuel 211 introduced to the DGA 210 to avoid damaging the DGA 210. For example, if too much of the liquid fuel 211 is introduced to the DGA 210, the DGA 210 may not be able to eject or discharge the liquid fuel 211 with enough rapidness to avoid the liquid fuel 211 from overflowing from the DGA 210 or from a large pressure building up within the DGA 210. The overflowing of the DGA 210 or the large build of pressure within the DGA 210 may cause undue stress and strain to components with the DGA 210, which may reduce the useful life span of the DGA 210 or result in failure of the DGA 210 due to components breaking or failing (e.g., breaking, cracking, shearing).

When the liquid fuel 211 is introduced to the TTA 208, the liquid fuel 211 enters a first end 228 of the TTA 208 and passes through the TTA 208 to exit at a second end 230 of the TTA 208 such that the liquid fuel 211 is introduced to the DGA 210 through a DGA valve 232. Under a normal operation (which is similar to the normal operation as discussed earlier with respect to FIG. 1), when the liquid fuel 211 enters the DGA 210 through the DGA valve 232, the liquid fuel 211 moves through the DGA 210 to a nozzle 234 (which is the same or similar to the nozzle 109 of the DGA 210 as discussed earlier with respect to FIGS. 2 and 3). The liquid fuel 211 is then ejected or discharged from the DGA 210 through the nozzle 234 in the form of stream of discrete droplets of the liquid fuel 211 or a continuous stream of the liquid fuel 211. The liquid fuel 211 may be ejected or discharged from the DGA 210 into a vacuum chamber, and, when in the vacuum chamber, the liquid fuel 211 is exposed to a laser generating EUV light.

Nozzle 109 ideally has a cross-section perpendicular to the flow of liquid fuel through nozzle 109 that is perfectly round with perfectly smooth surfaces; however, nozzle 109 may not be perfectly round and may not include perfectly smooth surfaces. When nozzle 109 is not perfectly round and does not include perfectly smooth surfaces, impurities within the liquid fuel are more prone to depositing or collecting on surfaces of the nozzle. Such collection of impurities can negatively impact the ability of the nozzle to produce droplets in a stable manner.

Figure 5:
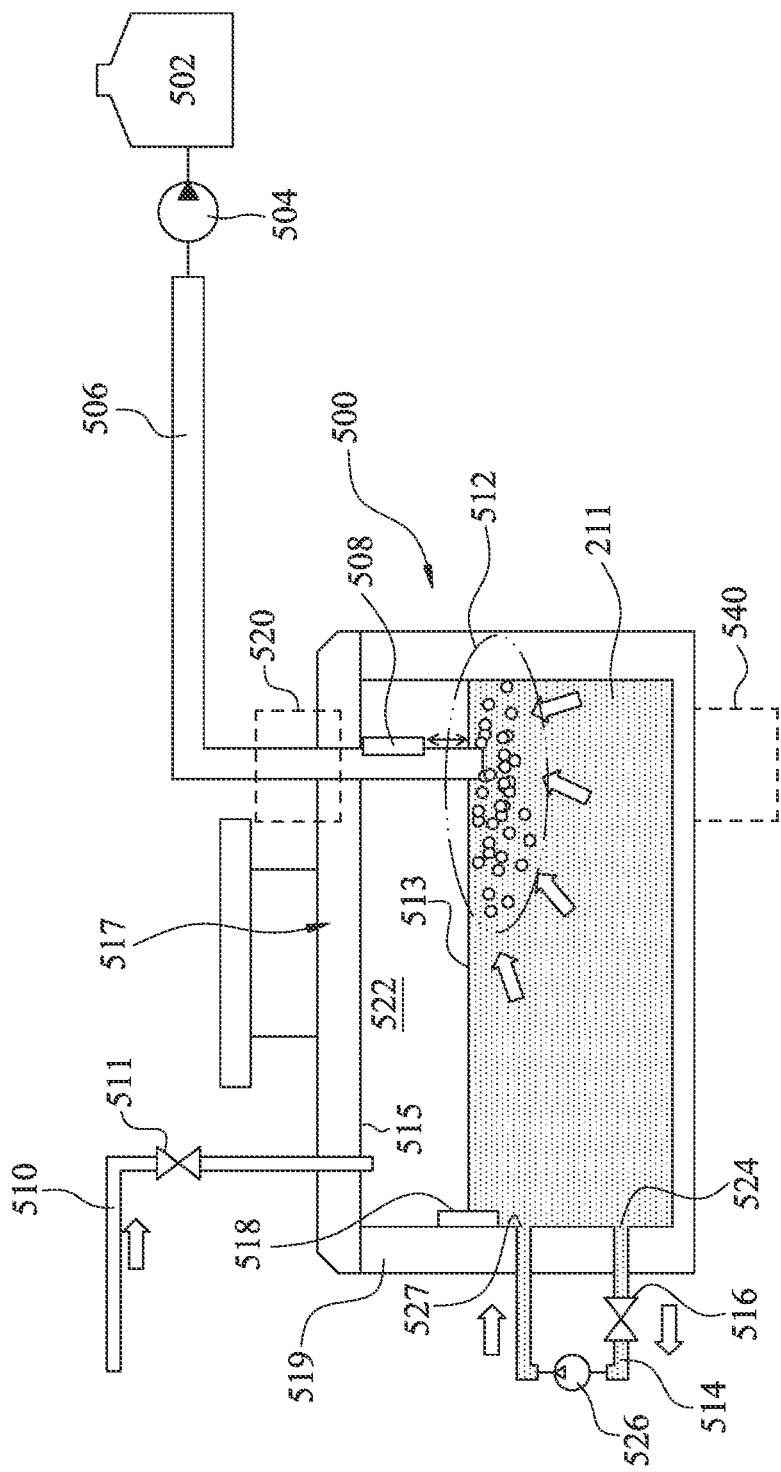
FIG. 5 is a schematic view of a vessel for containing a liquid fuel in accordance with an embodiment of the present disclosure.

Referring to FIG. 5, an enlarged view of a vessel 500 containing a liquefied fuel 211, e.g., liquefied tin, in accordance with an embodiment of the present disclosure is illustrated. Vessel 500 illustrated in FIG. 5 maybe the filter/tank 214 of RPA 202 in FIG. 4 or the vessels 220 and 222 of TSA 206 in FIG. 4 or other vessel of fuel delivery system 200 of FIG. 4. Also illustrated in FIG. 5 is an impurity tank 502, pump 504, suction conduit 506, level sensor 508, gas conduit and valve 511. FIG. 5 also illustrates additional features in accordance with an embodiment of the present disclosure, including gas conduit 510 and valve 511. In other embodiments, vessel 500 includes liquid fuel circulation conduit 514 and valve 516. In FIG. 5, an alternative to sensor 508 is illustrated as sensor 518 positioned on a sidewall 519 of vessel 500.

In FIG. 5, in accordance with embodiments of the present disclosure, liquid fuel 211 includes a plurality of impurities 512, which in FIG. 5, are illustrated as having collected or concentrated near an upper surface 513 of liquid fuel 211. Upper surface 513 is located at an interface between liquid fuel 211 and gas located above liquid fuel 211 within vessel 500. It is understood that in accordance with embodiments of the present disclosure, impurities 512 may not be concentrated as illustrated in FIG. 5 until after methods in accordance with the present disclosure are implemented.

Impurities 512 can be any material that negatively impacts the ability of DGA 210 to stably reproduce droplets used to generate extreme ultraviolet radiation. For example, impurities 512 may be oxides of the fuel, e.g., tin oxide when the fuel is tin. The impurities 512 may be bubbles of gas in liquid fuel 211. In other embodiments, the impurities may be materials present in the solid fuel which remain solid after the solid fuel is liquefied, i.e., melted.

In FIG. 5, impurity tank 502 is in fluid communication with pump 504 which is in fluid communication with suction conduit 506. An end of suction conduit 506 opposite pump 504 is positioned below upper surface 513 of liquid fuel 211 such that impurities located below the upper surface 513 can be drawn into suction conduit 506. Impurities located below the upper surface 513 are drawn into suction conduit 506 through operation of pump 504 and delivered to impurity tank 502 where the impurities can be separated from the liquid fuel. In accordance with embodiments of the present disclosure, when impurities located below upper surface 513 of liquid fuel 211 are drawn into suction conduit 506, some portion of liquid fuel 211 may also be drawn into suction conduit 506. In accordance with the embodiment illustrated in FIG. 5, a sensor 508 is attached to suction conduit 506 at a location that is between upper surface 513 of liquid fuel 211 and the lower surface 515 of a top 517 of vessel 500. In one embodiment, sensor 508 is a contact sensor which detects when liquid fuel 211 comes in contact with contact sensor 508. In an alternative embodiment, sensor 508 is a proximity sensor such as an infrared sensor that is able to detect a distance between sensor 508 and an upper surface 513 of liquid fuel 211. While sensor 508 is illustrated as being attached to suction conduit 506, in other embodiments, a sensor 518 (has capabilities similar to sensor 508) can be located on a sidewall 519 of vessel 500. In another embodiment, sensor 508 can be located on the lower surface 515 of the top 517.

Sensors 508 or 518 are utilized to detect the location of upper surface 513 of liquid fuel 211. The information regarding the location of upper surface 513 of liquid fuel 211 can be compared to a threshold value and used to control the flow of liquid fuel 211 into or out of vessel 500 so that end of suction conduit 506 does not penetrate too deeply into liquid fuel 211. When the end of suction conduit 506 penetrates too deeply into liquid fuel 211, the opening in the end of suction conduit 506 through which the impurities flow can be below the concentration of impurities. When the opening is below the concentration of impurities, the likelihood that such impurities will be sucked into the suction conduit 506 when pump 504 is activated decreases. For example, if the location of upper surface 513 is above the threshold value, thus indicating that the opening in the end of suction conduit 506 is penetrating too deeply into the liquid fuel, steps are taken to change the degree to which the end of suction conduit 506 penetrates into the liquid fuel. For example, the net flow of liquid fuel into vessel 500 can be reduced. Alternatively, when the location of upper surface 513 is above the threshold value, operation of pump 504 can be stopped such that liquid is not removed from the vessel 500. On the other hand, if the location of upper surface 513 is below the threshold value, thus indicating that the opening in the end of suction conduit 506 is not penetrating too deeply into liquid fuel, or may not be penetrating deeply enough, steps are taken to increase the degree to which the end of suction conduit 506 penetrates into the liquid fuel. For example, the net flow of liquid fuel into vessel 500 can be increased.

In accordance with embodiments of the present disclosure, due to the lower density of the impurities compared to the density of the liquid fuel, the impurities tend to rise within liquid fuel. For example, in some embodiments, the impurities are located in the upper ½ of the liquid fuel 211. In other embodiments, the impurities are located in the upper ¼ of the liquid fuel 211. In other embodiments, the impurities are located within about 1 to about 30 mm of the upper surface 513 of liquid fuel 211.

In FIG. 5, an optional suction conduit actuator 520 is illustrated. Optional suction conduit actuator 520 provides an alternative to controlling the penetration of suction conduit 506 into liquid fuel 211. Suction conduit actuator 520 is connected to top 517 of vessel 500 and is connected to suction conduit 506. In operation, suction conduit actuator 520 changes the location of the end of suction conduit 506 relative to the top 517 of vessel 500. For example, suction conduit actuator 520 can lower the end of suction conduit 506 relative to the top 517 of vessel 500 or it may raise the end of suction conduit 506 relative to the top 517 of vessel 500. In this manner, suction conduit actuator 520 is able to maintain the end of suction conduit 506 in the portion of the liquid fuel 211 where the impurities are collecting or concentrating. Suction conduit actuator 520 may be powered by a servo motor or other drive mechanism capable of precisely positioning the end of suction conduit 506 relative to the upper surface 513 of liquid fuel 211.

The system illustrated in FIG. 5 also includes a gas conduit 510 in fluid communication with the headspace 522 in vessel 500. In accordance with embodiments of the present disclosure, gas conduit 510 is utilized to deliver an inert gas to headspace 522 in order to prevent or reduce oxidation of liquid fuel in vessel 500. Gas conduit 510 includes a valve 511 for controlling the flow of an inert gas, e.g., argon or hydrogen gas, into headspace 522. Gas conduit 510 can also be in fluid communication with a vacuum source so that a vacuum can be pulled on the headspace 522. For example, a positive pressure can be provided in headspace 522 by delivering gas to headspace, a negative (i.e., vacuum) pressure can be provided in headspace 522 by pulling a vacuum on headspace 522 or alternating positive pressures and negative pressures can be provided in headspace 522. In accordance with some embodiments of the present disclosure, decreasing the pressure in headspace 522, may promote the rising of the gas bubbles through the liquid fuel or promote gases dissolved within the liquid fuel to come out of the liquid fuel. In other embodiments of the present disclosure, alternating the pressure from a positive pressure to a negative pressure (e.g., a vacuum pressure) or a higher pressure and a lower pressure in headspace 522 may promote the rising of impurities through the liquid fuel.

The system illustrated in FIG. 5 also includes an optional liquid fuel circulation conduit 514 that includes an inlet 524 and an outlet 527, both in fluid communication with the interior of vessel 500. Liquid fuel circulation conduit 514 includes a valve 516 and pump 526 for controlling flow of liquid fuel 211 through liquid fuel circulation conduit 514. In accordance with embodiments of the present disclosure, liquid fuel circulation conduit 514, valve 516 and pump 526 are utilized to circulate liquid fuel out of and back into vessel 500 in order to create currents, e.g., vortices, within liquid fuel 211 in vessel 500 that promote the concentration of impurities 512 at a location where they can be removed from vessel 500 via suction conduit 506.

The embodiment illustrated in FIG. 5 includes an optional agitation subsystem 540 for agitating the liquid fuel. Agitation subsystem 540 can include devices capable of agitating the liquid fuel. For example, agitation subsystem 540 can include a stirrer for agitating the liquid fuel. In another example, agitation subsystem 540 includes a source of sonic energy which can be directed into the liquid fuel or which can cause vibration or agitation of the vessel 500 which would have the effect of agitating liquid fuel within vessel 500.

Figure 6:
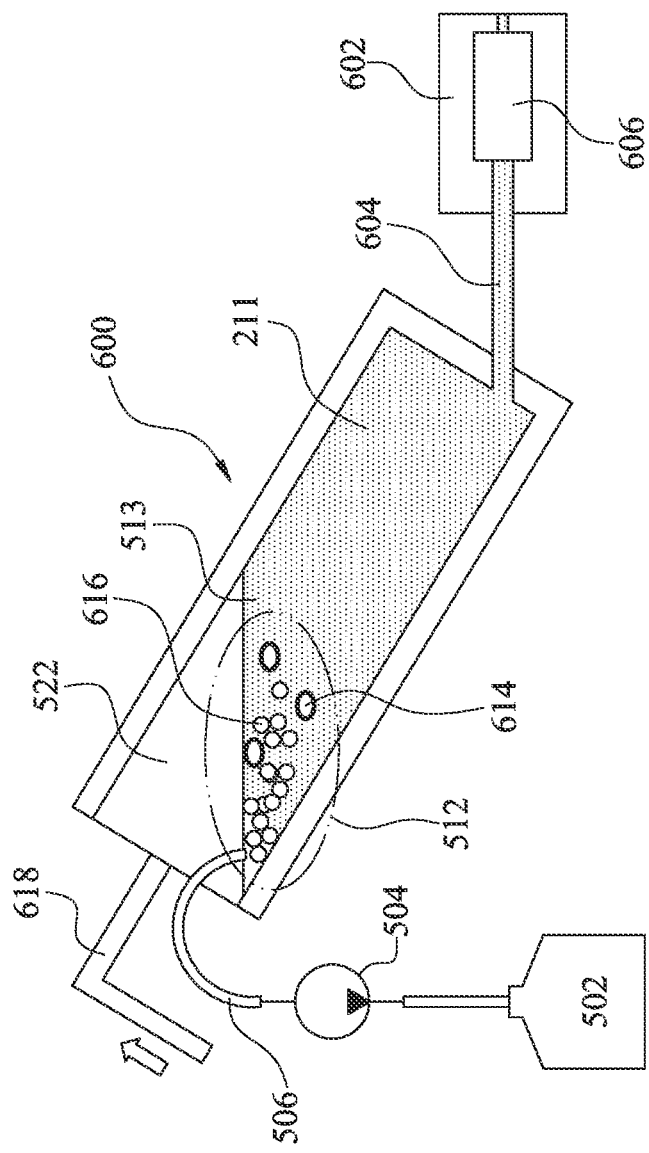
FIG. 6 is a schematic view of another vessel for containing a liquid fuel in accordance with an embodiment of the present disclosure.

Referring to FIG. 6, embodiments in accordance with methods of the present disclosure can be implemented in other types of vessels besides a vessel of an RPA or TSA. For example, as illustrated in FIG. 6, methods of the present disclosure can be implemented in a fuel reservoir 600 of a DGA 210 in FIG. 4 or 108 in FIGS. 1-3. The fuel reservoir 600 of a DGA is in fluid communication with a nozzle 602 through which the fuel flows to generate droplets. Nozzle 602 is in fluid communication with reservoir 600 through the conduit 604. Nozzle 602 is associated with at least one filter and one valve, schematically illustrated together as 606. Features illustrated in FIG. 6, to which the descriptions of FIG. 5 are applicable are identified by the same reference numerals used in FIG. 5. The embodiment illustrated in FIG. 6, includes an impurity tank 502, a pump 504 and a suction conduit 506. As in the embodiment of FIG. 5, an end of suction conduit 506 opposite impurity tank 502 is positioned below the surface 513 of liquid fuel 211 where it can draw impurities 512 into suction conduit 506. Impurities 512 include gas bubbles 614 and non-gas impurities 616, e.g., solid particles such as oxides of the liquid fuel. The embodiment of FIG. 6 also includes a source 618 of inert gas, e.g., such as argon or hydrogen that is used to provide pressure which drives the liquid fuel into conduit 604. As with the embodiment described above with reference to FIG. 5, operation of pump 504 draws impurities 512 into suction conduit 506 and thereby prevents the impurities 512 from negatively impacting the ability of nozzle 602 to generate droplets in a stable and reproducible manner. Though not illustrated in FIG. 6, the embodiment of FIG. 6 can include sensors similar to sensors 508 and 518 described with reference to FIG. 5. The embodiment of FIG. 6 can also include suction conduit actuator 520 and liquid fuel circulation conduit 514, including valve 516 and pump 526.

Figure 7:
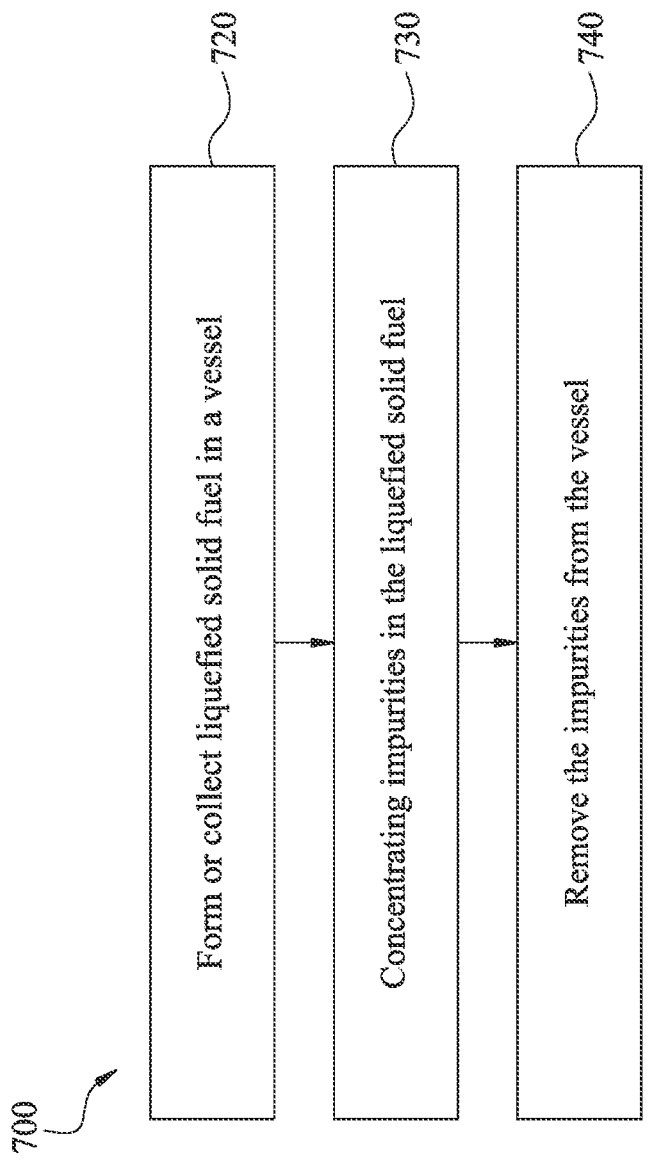
FIG. 7 is a flow diagram of a method in accordance with an embodiment of the present disclosure.

FIG. 7 is a flow diagram of a method 700 for processing a fuel of an EUV photolithography system. At 720, the method 700 includes collecting a liquefied solid fuel in a vessel. One example of collecting a liquefied fuel includes heating solid fuel in heating component 212 of refill and priming assembly RPA 202 and flowing the liquefied fuel to filter/tank 214 where it will be collected. At 730, impurities in the liquefied fuel contained in the filter/tank 214 are collected or concentrated as described above with reference to FIGS. 5 and 6. An example of concentrating the impurities in the liquefied fuel includes allowing the impurities to rise through the liquefied fuel. Impurities such as oxides of the liquid fuel or gas bubbles within the liquid fuel have a density that is less than the density of the liquid fuel and thus, are able to rise through the liquid fuel. In some embodiments, the impurities can be concentrated by agitating the liquefied fuel as described above or by creating currents or vortices within the liquefied fuel as described above. At 740, the concentrated impurities 512 are removed from the vessel 500. An example of removing impurities 512 from the vessel 500 includes suctioning the impurities out of the vessel through suction conduit 506 as described above with reference to FIG. 5. In accordance with some embodiments of the method illustrated in FIG. 6, removal of the impurities 512 from vessel 500 includes removing a portion of liquefied fuel from vessel 500.

Figure 8:
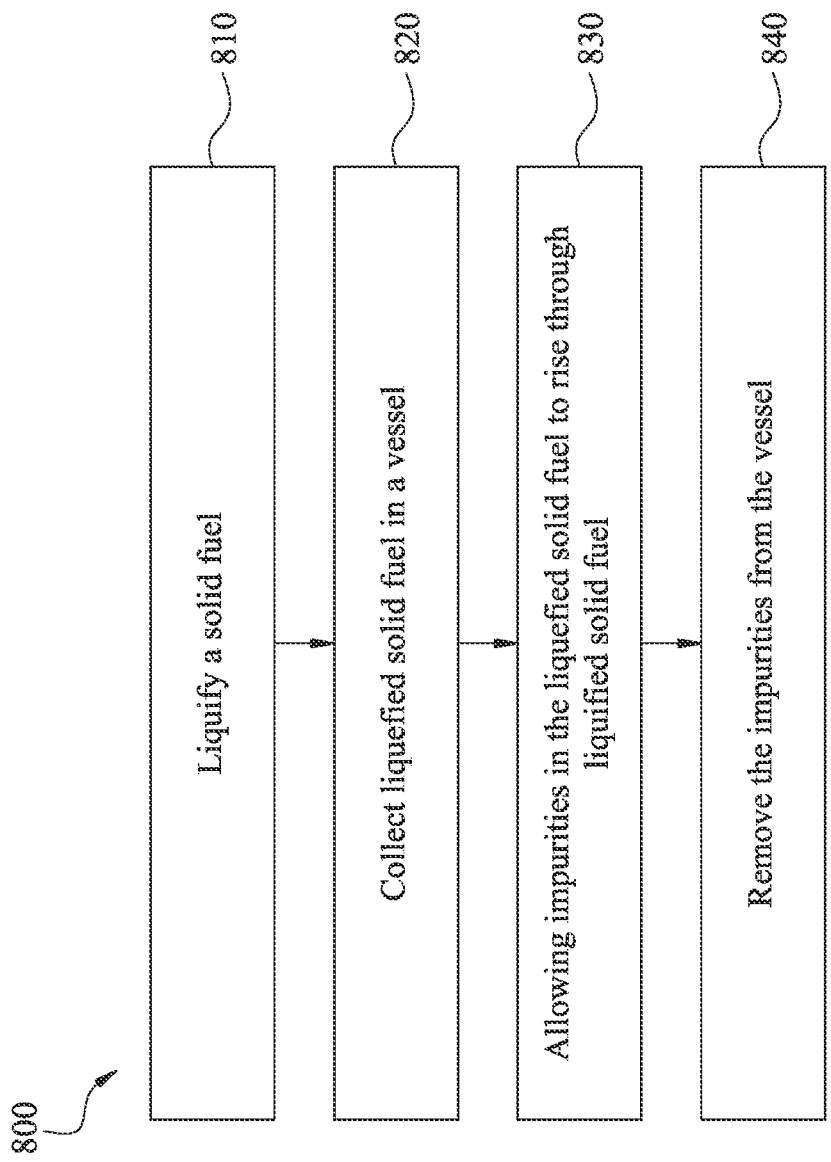
FIG. 8 is a flow diagram of a method in accordance with an embodiment of the present disclosure.

FIG. 8 is a flow diagram of another method 800 in accordance with embodiments described herein for removing impurities from a liquid fuel used to generate droplets in an EUV photolithography system. At 810, a solid fuel is liquefied. An example of how a solid fuel is liquefied includes heating a solid fuel in heating component 212 of refill and priming assembly RPA 202. At 820, the method 800 includes collecting the liquefied solid fuel in a vessel. One example of collecting a liquefied fuel in a vessel includes flowing the liquefied fuel from heating component 212 to filter/tank 214 where it is collected. At 830, impurities 512 in the liquefied fuel 211 contained in the filter/tank 214 are allowed to rise through the liquefied fuel. As discussed above, the impurities 512 rise through the liquefied fuel 211 because the density of the impurities is less than the density of the liquefied fuel. As the impurities rise through the liquefied fuel, they collect and concentrate near the interface 513 between the liquefied fuel 211 and the gas containing headspace 522 in vessel 500. At 840, collected or concentrated impurities 512 are removed from vessel 500 via suction conduit 506 as described above with reference to FIG. 5.

In one embodiment in accordance with the present disclosure, a method of processing fuel in an EUV photolithography system includes forming a volume of liquid fuel in a vessel. The liquid fuel includes impurities which are concentrated in the liquid fuel. After the impurities in the liquid fuel have concentrated, they are removed from the vessel. Removing the impurities from the liquid fuel increases the likelihood that a DGA fed with such cleansed fuel will be able to generate droplets stably and for an extended period of time as compared to a DGA supplied with liquid fuel that has not had the impurities removed. Increasing the ability of the DGA to generate droplets stably for an extended period of time decreases the number of wafers due to poor photolithographic patterning and increases the length of time between regular maintenance of the DGA and/or replacement of the DGA.

In another embodiment, a method in accordance with the present disclosure includes liquefying a solid fuel and collecting the liquefied solid fuel in a vessel. In accordance with this embodiment, impurities in the liquefied solid fuel are allowed to rise towards an interface between the liquefied solid fuel in the vessel and the gas in the vessel. The impurities which have risen towards an interface between the liquefied solid fuel in the vessel and the gas in the vessel are removed from the vessel.

An embodiment of a method of purifying a fuel in an EUV photolithography system in accordance with the present disclosure includes collecting a liquefied tin fuel in a vessel. Impurities in the liquefied tin fuel are caused to rise through the liquefied tin fuel, e.g., by agitating the liquefied tin fuel or reducing the pressure above the liquefied tin fuel concentrates. The rising impurities concentrate before being removed from the vessel with a portion of the liquefied tin fuel.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of processing fuel in an EUV photolithography system, the method comprising:
    forming a volume of liquid fuel in a vessel, the liquid fuel including impurities;
    concentrating the impurities in the liquid fuel; and
    suctioning the impurities out of the liquid fuel.

2. The method of claim 1, wherein the concentrating the impurities in the liquid fuel includes concentrating one or more of oxides of the liquid fuel and bubbles of gas in the liquid fuel.

3. The method of claim 1, wherein the liquid fuel is molten tin.

4. The method of claim 1, wherein the concentrating the impurities in the liquid fuel includes allowing the impurities to rise through the liquid fuel.

5. The method of claim 1, wherein the concentrating the impurities in the liquid fuel includes generating a fluid flow pattern in the vessel that concentrates the impurities.

6. The method of claim 5, wherein generating a flow pattern in the vessel that concentrates the impurities includes generating a vortex within the liquid fuel.

7. The method of claim 1, wherein the impurities are suctioned out of the liquid fuel via a suction tube.

8. The method claim 7, wherein the suctioning of impurities out of the liquid fuel via the suction tube ceases when a level of the liquid fuel in the vessel rises above a threshold level.

9. The method claim 1, further comprising altering a distance that a suction tube penetrates into the liquid fuel.

10. The method of claim 1, further comprising ceasing the suctioning of the impurities out of the liquid fuel when a level of the liquid fuel rises above a threshold level.

11. A method comprising:
    liquefying a solid fuel;
    collecting the liquefied fuel in a vessel;

allowing impurities in the liquefied fuel to rise to an interface between the liquefied fuel in the vessel and a gas in the vessel;

adjusting a distance a suction tube penetrates into the liquified fuel; and removing the impurities from the vessel.

12. The method of claim 11, further comprising ceasing the removing the impurities from the vessel when a level of the liquefied fuel rises above a threshold level.

13. The method of claim 12, further comprising determining the level of the liquefied fuel has risen above the threshold level utilizing a sensor configured to detect a surface of the liquefied fuel.

14. The method of claim 12, wherein the liquefied fuel is tin.

15. The method of claim 14, wherein the impurities are oxides of tin.

16. The method of claim 11, further comprising ceasing the removing from the vessel, a portion of the liquified tin fuel containing the concentrated impurities when a level of the liquified tin fuel rises above a threshold level.

17. A method of purifying a fuel in an EUV photolithography system, the method comprising:

collecting a tin fuel in a liquid phase in a vessel;

causing impurities in the tin fuel in a liquid phase to rise through the tin fuel in a liquid phase;

concentrating the impurities in the tin fuel in a liquid phase; and removing from the vessel, a portion of the tin fuel in a liquid phase containing the concentrated impurities.

18. The method of claim 17, wherein the causing impurities in the tin fuel in a liquid phase to rise through the tin fuel in a liquid phase includes agitating the tin fuel in a liquid phase.

19. The method of claim 17, wherein the causing impurities in the tin fuel in a liquid phase to rise through the tin fuel in a liquid phase includes reducing pressure above the tin fuel in a liquid phase.

20. The method of claim 19, wherein the causing impurities in the tin fuel in a liquid phase to rise through the tin fuel in a liquid phase includes alternating between a positive pressure and a vacuum pressure.

* * * * *